(12) United States Patent
Hidaka

(10) Patent No.: US 6,844,740 B2
(45) Date of Patent: Jan. 18, 2005

(54) MEASURING A SIGNAL USING A PROGRAMMABLE GAIN AMPLIFIER

(75) Inventor: Yasuo Hidaka, Cupertino, CA (US)

(73) Assignee: Fujitsu Limited, Kawasaki (JP)

( * ) Notice: Subject to any disclaimer, the term of this patent is extended or adjusted under 35 U.S.C. 154(b) by 36 days.

(21) Appl. No.: 10/359,978

(22) Filed: Feb. 7, 2003

(65) Prior Publication Data

US 2004/0155643 A1 Aug. 12, 2004

(51) Int. Cl.$^7$ ............................................. G01R 27/28
(52) U.S. Cl. ...................................................... 324/616
(58) Field of Search ................................. 324/616, 601, 324/605–608; 330/254, 129; 375/345

(56) References Cited

U.S. PATENT DOCUMENTS

2003/0215032 A1 * 11/2003 Langlais et al. ............ 375/345

OTHER PUBLICATIONS

David A. Johns and Daniel Essig, *Integrated Circuits for Data Transmission Over Twisted–Pair Channels*, IEEE Journal of Solid–State Circuits, vol. 32, No. 3, pp. 398–406, Mar. 1997.
Mohammed Hossein Shakiba, David A. Johns, and Kenneth W. Martin, *An Integrated 200–MHz 3.3–V BiCMOS Class–IV Partial–Response Analog Viterbi Decoder*, IEEE Journal of Solid–State Circuits, vol. 33 No. 1, pp. 61–75, Jan. 1998.
Kamran Azadet, Meng–Lin Yu, Patrik Larsson, David Inglis, *WA 18.3 A Gigabit Transceiver Chip Set for UTP CAT–6 Cables in Digital CMOS Technology*, IEEE International Solid–State Circuits Conference, 9 pages, 2000.
Patent Pending Application entitled "Equalizing A Signal For Transmission", by Yoichi Koyanagi, et al., 31 total pages, Jan. 30, 2003.
Patent Pending Application entitled "Method and System for Processing A Sampled Signal", by Yasuo (nmi) Hidaka, 39 total pages, Feb. 5, 2003.
Patent Pending Application entitled "Method and System for Providing Error Compensation To A Signal Using Feedback Control", by Yasuo (nmi) Hidaka, 42 total pages, Feb. 5, 2003.
Patent Pending Application entitled "Method and System for Signal Processing Using Vector Output From Scalar Data", by Yasuo (nmi) Hidaka, 40 total pages, Feb. 5, 2003.
Patent Pending Application entitled "Processing A Received Signal At A Detection Circuit", by Yasuo Hidaka, 38 total pages, Feb. 7, 2003.

* cited by examiner

*Primary Examiner*—Jay Patidar
*Assistant Examiner*—Amy He
(74) *Attorney, Agent, or Firm*—Baker Botts L.L.P.

(57) ABSTRACT

Measuring a signal includes setting a gain numerator of a gain value and setting a gain denominator of the gain value, where the gain value is a ratio of the gain numerator to the gain denominator. An input signal is received and adjusted in accordance to the gain value to yield an output signal. The input signal is determined using the output signal and a reciprocal of the gain value, where the reciprocal is a ratio of the gain denominator to the gain numerator.

17 Claims, 2 Drawing Sheets

MEASURING A SIGNAL USING A PROGRAMMABLE GAIN AMPLIFIER

TECHNICAL FIELD OF THE INVENTION

This invention relates generally to the field of signal measurement and more specifically to measuring a signal using a programmable gain amplifier.

BACKGROUND OF THE INVENTION

Circuits that measure a signal may need to satisfy a number of requirements. For example, a circuit may be required to provide more precise measurements at certain values and a wide range of possible measurement inputs with less precise measurements at other values. As another example, the range of precise values may be required to be adjustable. Unfortunately, known techniques for measuring a signal often cannot meet these requirements. Consequently, known techniques for measuring a signal are unsatisfactory for certain situations.

SUMMARY OF THE INVENTION

In accordance with the present invention, disadvantages and problems associated with previous techniques for measuring a signal may be reduced or eliminated.

According to one embodiment of the present invention, measuring a signal includes setting a gain numerator of a gain value and setting a gain denominator of the gain value, where the gain value is a ratio of the gain numerator to the gain denominator. An input signal is received and adjusted in accordance to the gain value to yield an output signal. The input signal is determined using the output signal and a reciprocal of the gain value, where the reciprocal is a ratio of the gain denominator to the gain numerator.

Certain embodiments of the invention may provide one or more technical advantages. A technical advantage of one embodiment may be that a monitor circuit measures an input signal by applying a gain, represented by a gain value, to the input signal to yield an output signal. The input signal may be determined from the output signal and the reciprocal of gain value. The numerator and the denominator of the gain value may be adjusted such that the monitor may provide more precise measurements around certain values and less precise measurements around other values.

Certain embodiments of the invention may include none, some, or all of the above technical advantages. One or more other technical advantages may be readily apparent to one skilled in the art from the figures, descriptions, and claims included herein.

BRIEF DESCRIPTION OF THE DRAWINGS

For a more complete understanding of the present invention and its features and advantages, reference is now made to the following description, taken in conjunction with the accompanying drawings, in which.

DETAILED DESCRIPTION OF THE DRAWINGS

Figure 1:
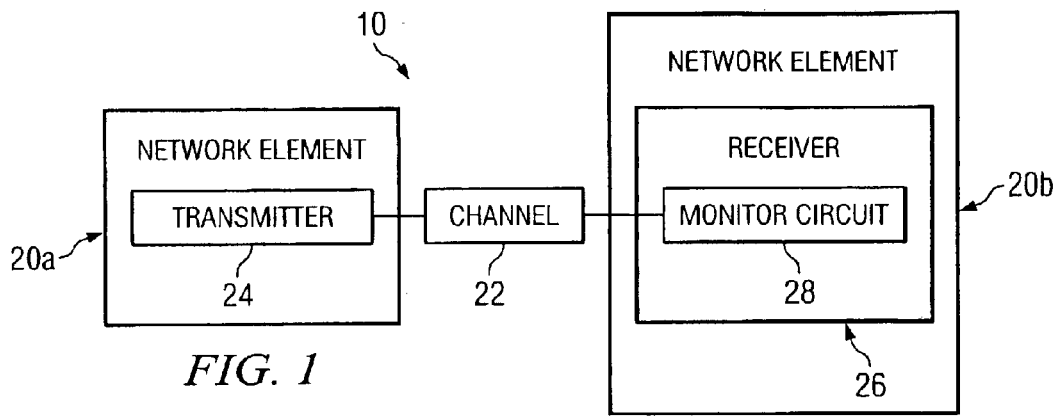
FIG. 1 is a block diagram illustrating one embodiment of a network that includes a receiver with a monitor circuit that may be used to measure a signal.
Figure 2:
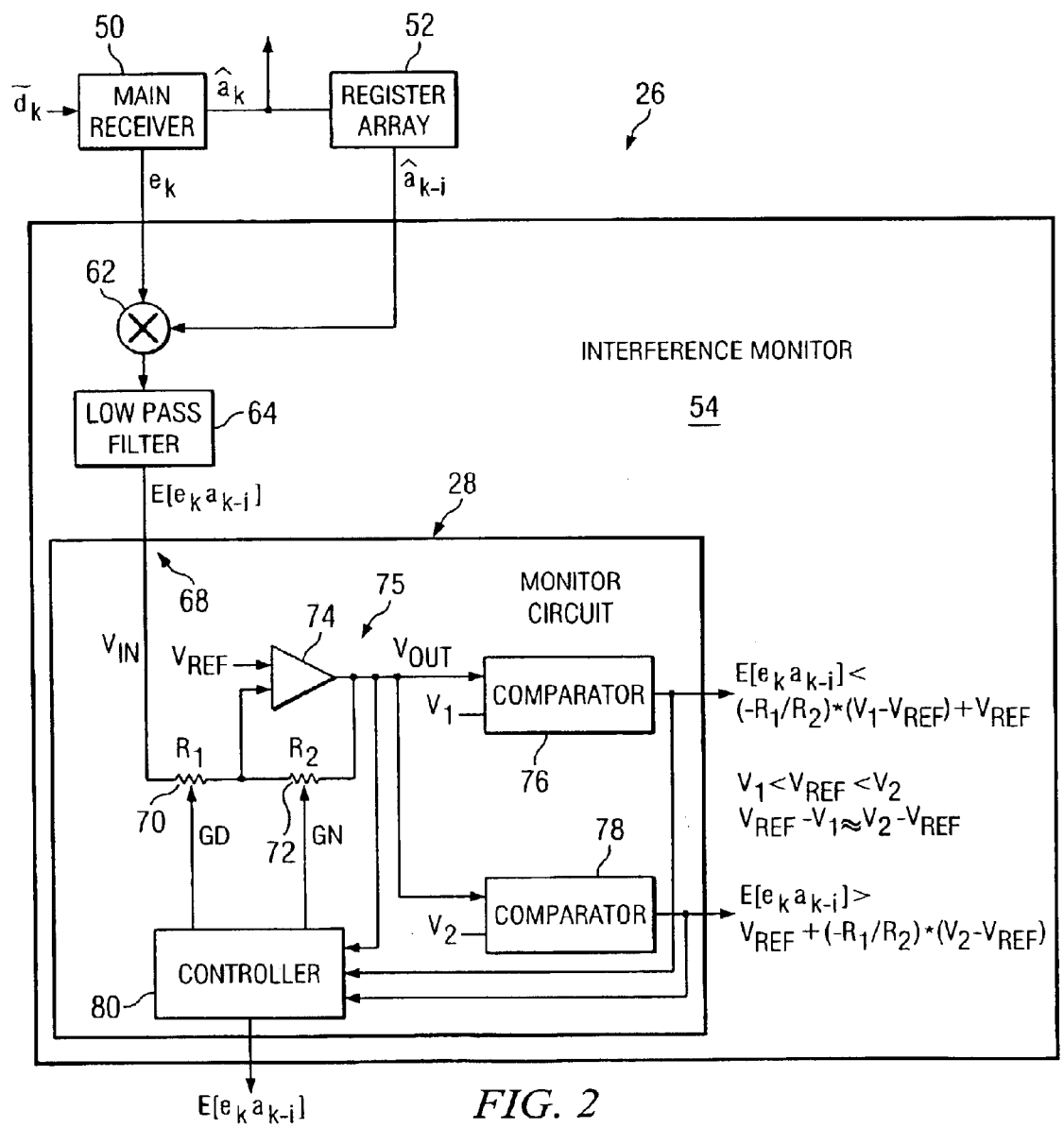
FIG. 2 is a block diagram illustrating one embodiment of a receiver that includes a monitor circuit for measuring a signal using a programmable gain amplifier.
Figure 3:
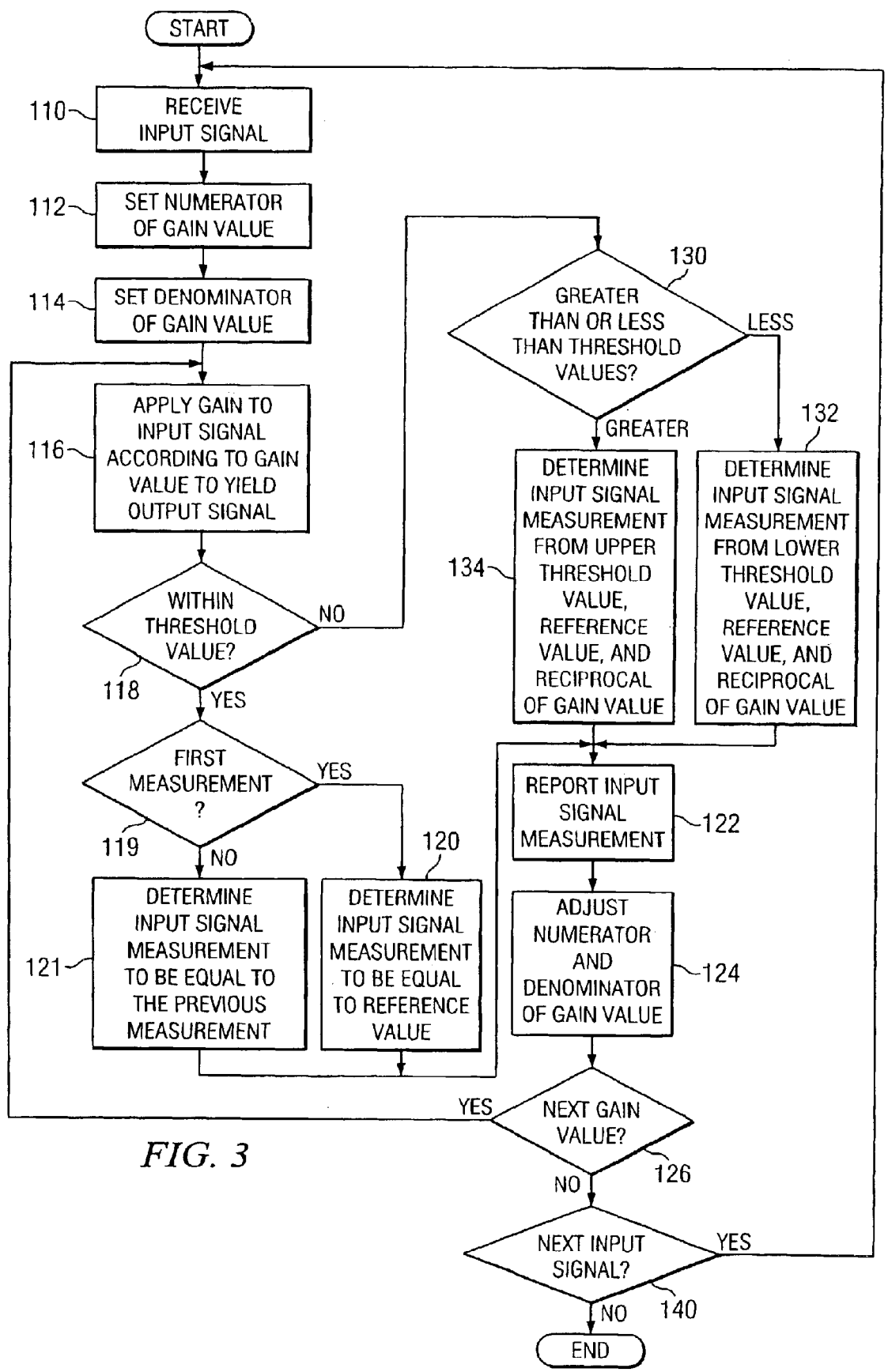
FIG. 3 is a flowchart illustrating one embodiment of a method for measuring a signal using a programmable gain amplifier.

Embodiments of the present invention and its advantages are best understood by referring to FIGS. 1 through 3 of the drawings, like numerals being used for like and corresponding parts of the various drawings.

FIG. 1 is a block diagram illustrating one embodiment of a network 10 that includes a receiver with a monitor circuit that may be used to measure a signal. The monitor circuit applies a gain, represented by a gain value, to an input signal to yield an output signal. The input signal may be determined from the output signal and the reciprocal of the gain value. The numerator and the denominator of the gain value may be adjusted such that the monitor may provide more precise measurements around certain values and less precise measurements around other values.

Network 10 includes network elements 20a–b and a channel 22 coupled as shown in FIG. 1. Network elements 20a–b may comprise elements that transmit and receive signals such as servers, routers, computer systems, or any combination of the proceeding. A signal comprises an electrical quantity such as current or voltage that can be used to convey information.

Channel 22 may comprise a cable having a length in the range of ten to one hundred meters such as approximately twenty to forty meters. The speed of a signal traveling through channel 22 may be in the range of multi-gigabits per second such as approximately three gigabits per second. As an example, channel 22 may operate according to the 10 Gigabit Attachment Unit Interface (XAUI) standards, which require a fixed frequency of 3.125 gigabits and is used for 10 Gigabit Ethernet.

Network element 20a includes a transmitter 24, and network element 20b includes a receiver 26. Transmitter 24 transmits a signal through channel 22 to receiver 26. A monitor circuit 28 of receiver 26 may be used to measure a signal to determine a voltage value. Monitor circuit 28 is described in more detail with reference to FIG. 2. A method for measuring a signal is described with reference to FIG. 3.

FIG. 2 is a block diagram illustrating one embodiment of receiver 26 that includes monitor circuit 28 for measuring a signal. Receiver 26 receives a signal $\breve{d}_k$ transmitted through channel 22 from transmitter 24, and processes received signal $\breve{d}_k$ to generate a recovered data sequence $\hat{a}_k$. Receiver 26 includes a main receiver 50, a register array 52, and an interference monitor 54 coupled as shown in FIG. 2.

Main receiver 50 processes received signal $\breve{d}_k$ to generate recovered data sequence $\hat{a}_k$. Main receiver 50 may include a decision feedback filter and an error estimator. The decision feedback filter determines an estimated interference from recovered data sequence $\hat{a}_k$, and subtracts the estimated interference from received signal $\breve{d}_k$ to compensate for the interference. Error estimator determines a signal amplitude error $e_k$ that represents the difference between a noisy received signal $\breve{d}_k$ and an estimated noiseless received signal $\hat{d}_k$.

Register array 52 delays recovered data sequence $\hat{a}_k$ to yield delayed recovered data sequence $\hat{a}_{k-i}$. Register array 52 may include an array of interleaved master and slave latches that perform a delay function on recovered data sequence $\hat{a}_k$. The latches may capture specific data of data sequence $\hat{a}_k$ at flip-flops for use by interference monitor 54. Register array 52 may be set to latch the same data as error $e_k$ in order to generate cross-correlation $E[e_k a_{k-i}]$.

Interference monitor 54 measures interference such as residual inter-symbol interference (ISI) using error $e_k$ and delayed recovered data sequence $â_{k-i}$. The residual inter-symbol interference may be measured as a cross-correlation $E[e_k a_{k-i}]$ between error $e_k$ and delayed recovered data sequence $â_{k-i}$ as a function of the delay i. If there is no interference between error $e_k$ and delayed recovered data sequence $â_{k-i}$, then cross-correlation $E[e_k a_{k-i}]$ is substantially zero. If there is a positive or negative interference, then cross-correlation $E[e_k a_{k-i}]$ is positive or negative, respectively, and proportional to the magnitude of the interference.

Interference monitor 54 measures one component of the interference at one time. To measure the interference over a period of time, interference monitor 54 changes the timing of register array 52 to perform repeated measurements to cover the period of time. Interference monitor 54 includes a multiplier 62, a low pass filter 64, and a monitor circuit 28 coupled as shown in FIG. 2. Multiplier 62 multiplies error $e_k$ and data sequence $â_{k-i}$. Multiplier 62 may comprise a switched-capacitor network, which may also operate as a switched-capacitor resistor at the front end of low pass filter 64. Low pass filter 64 filters the result from multiplier 62 to yield cross-correlation $E[e_k a_{k-i}]$ between signal error $e_k$ and data sequence $â_{k-i}$. Low pass filter 64 may comprise a capacitor and a buffer.

Monitor circuit 28 measures the cross-correlation signal to determine a value for cross-correlation $E[e_k a_{k-i}]$. In the illustrated example, the value for cross-correlation $E[e_k a_{k-i}]$ is represented by an input signal $V_{in}$ input into monitor circuit 28. Monitor circuit 28 operates in accordance with three threshold values $V_1$, $V_2$ and $V_{ref}$, where $V_1 < V_{ref} < V_2$. Monitor circuit 28 provides more precise measurements of input signals that are closer to $V_{ref}$. $V_1$ and $V_2$ may be chosen so that $V_{ref} - V_1 = V_2 - V_{ref}$ in order to balance the precision of the measurements for input signals less than $V_{ref}$ and input signals greater than $V_{ref}$. For example, if $V_{ref}$ is zero, the monitor circuit 28 provides more precise measurements around zero, and the precision of measurements for positive values and negative values are matched.

Monitor circuit 28 includes an input 68, a programmable gain amplifier 75, comparators 76 and 78, and a controller 80 coupled as shown in FIG. 2. Programmable gain amplifier 75 includes programmable resistors 70 and 72 and amplifier 74, coupled as shown in FIG. 2. Programmable resistor 70 has a programmable resistance $R_1$, and programmable resistor 72 has a programmable resistance $R_2$. Amplifier 74 amplifies an input signal $V_{in}$ in accordance with a gain value and a reference signal $V_{ref}$ to yield output signal $V_{out}$. Reference signal $V_{ref}$ may come from an external pin. Amplifier 74 may comprise, for example, an operational amplifier. In the illustrated embodiment, input signal $V_{in}$, reference signal $V_{ref}$, and output signal $V_{out}$ represent voltages.

Input signal $V_{in}$ is related to output signal $V_{out}$ according to Equation (1):

$$V_{out} = \frac{-R_2}{R_1}(V_{in} - V_{ref}) + V_{ref} \qquad (1)$$

where ratio $$\frac{R_2}{R_1}$$

represents the gain value, numerator $R_2$ represents the gain numerator GN, and denominator $R_1$ represents the gain denominator GD.

Input voltage $V_{in}$ may be calculated using output voltage $V_{out}$. If $V_{in} < V_{ref}$, the gain is controlled so that $V_{out}$ is equal to $V_1$. If $V_{in} > V_{ref}$, the gain is controlled so that $V_{out}$ is equal to $V_2$. Since $V_1$, $V_2$, and $V_{ref}$ are constant, $V_{in}$ is calculated from the gain value according to linear function of the reciprocal of the gain.

If $V_{out}$ is equal to $V_1$, $V_{in}$ may be calculated according to Equation (2):

$$V_{in} = \frac{-R_1}{R_2}(V_1 - V_{ref}) + V_{ref} \qquad (2)$$

If $V_{out}$ is equal to $V_2$, $V_{in}$ may be calculated according to Equation (3):

$$V_{in} = \frac{-R_1}{R_2}(V_2 - V_{ref}) + V_{ref} \qquad (3)$$

If $V_{in}$ is equal to or very close to $V_{ref}$, $V_{out}$ may be between $V_1$ and $V_2$ even for the maximum gain value. In such a condition, $V_{in}$ is considered to be same as $V_{ref}$. Accordingly, $V_{in}$ may be calculated according to Equation (4):

$$V_{in} = V_{ref} \qquad (4)$$

TABLE 1 illustrates example gain numerators $R_2$, gain denominators $R_1$, and the gain reciprocal values $R_1/R_2$. The values presented in TABLE 1 are for illustration purposes only.

TABLE 1

| | | $R_2$ | | |
|---|---|---|---|---|
| $R_1/R_2$ | 1 | 2 | 3 | 4 |
| $R_1$    1 | 1 | ½ | ⅓ | ¼ |
|          2 | 2 | 1 | ⅔ | ½ |
|          3 | 3 | 3/2 | 1 | ¾ |
|          4 | 4 | 2 | 4/3 | 1 |

As illustrated by TABLE 1, there are as many gain-reciprocal values between zero and one as there are between one and four, and the gain-reciprocal values nearer to zero are closer together. Accordingly, the gain-reciprocal values may be more precisely adjusted closer to zero, and may provide more precise measurements in a range around zero corresponding to $V_{in}$ values around $V_{ref}$.

Reference value $V_{ref}$ may be adjusted according to the offset of $V_{in}$ that is the effective zero value of $V_{in}$, to provide more precise measurements of $V_{in}$ around the effective zero value. Providing more precise measurements around the effective zero may be useful for, for example, measuring cross-correlation $E[e_k a_{k-i}]$. Typically, values of interference closer to the effective zero value exhibit smaller differences, so more precise measurements may be needed closer to the effective zero value.

Comparator 76 compares output signal $V_{out}$ and lower threshold value $V_1$ to determine if output signal $V_{out}$ is less than lower threshold value $V_1$. If output signal $V_{out}$ is less than $V_1$, then comparator 76 reports that the cross-correlation signal is effectively negative with a magnitude proportional to the gain reciprocal and the difference between $V_{ref}$ and lower threshold value $V_1$. Comparator 78 compares output signal $V_{out}$ to upper threshold value $V_2$ to determine if output signal $V_{out}$ is greater than upper threshold value $V_2$. If output signal $V_{out}$ is larger than upper threshold value $V_2$, comparator 78 outputs that cross-correlation signal is effectively positive with a magnitude proportional to the gain reciprocal and the difference between $V_{ref}$ and upper threshold value $V_2$. Comparators 76 and 78 may comprise auto-zero comparators with controlled positive and negative offset. Lower threshold value $V_1$ may be set at approximately reference signal $V_{ref}$ minus a delta value $\Delta$, and upper threshold value $V_2$ may be set at reference signal $V_{ref}$ plus a delta value $\Delta$. Delta value $\Delta$ may comprise any suitable value, such as approximately 200 millivolts.

Controller 80 controls the gain value by adjusting programmable resistors 70 and 72. Controller 80 sends a gain denominator GD signal to adjust programmable resistance $R_1$, and gain numerator GN signal to adjust programmable resistance $R_2$. Controller receives feedback from comparators 76 and 78 to determine if output signals $V_{out}$ is within or outside of threshold values $V_1$, and $V_2$ and adjusts gain numerator GN signal and gain denominator GD signal in response to the information. For example, the gain value may be decreased to generate smaller output signals that may more likely fall within threshold values $V_1$, and $V_2$. Conversely, the gain value may be increased to generate larger output signals that may more likely fall outside of threshold values $V_1$ and $V_2$.

Controller 80 calculates the value of cross-correlation signal $E[e_k a_{k-i}]$ represented by input signal $V_{in}$, from output signal $V_{out}$. The input signal $V_{in}$ may be calculated using Equations (2) through (4).

Modifications, additions, or omissions may be made to the system without departing from the scope of the invention. For example, programmable gain amplifier 75 may include programmable capacitors in place of programmable resistors 70 and 72 with additional initialization circuits. With capacitive feedback and appropriate initialization, it is possible to cancel the offset of the amplifier. Since the input impedance is high, the output buffer in the low pass filter may be omitted. The capacitance values of the capacitors may operate as gain denominator GD and gain numerator GN of the gain value of monitor circuit 28. Additionally, functions may be performed using any suitable logic comprising software, hardware, other logic, or any suitable combination of the preceding.

As described above, programmable gain amplifier 75 may utilize capacitive feedback or resistive feedback. Capacitive feedback may provide the capability for compensating for the offset of the amplifier using an autozero circuit. In an autozero circuit, a capacitor is initialized with an initial charge across the electrodes during an initialization period to compensate for the offset of the circuit. Moreover, the DC input impedance of the circuit is very high (ideally infinite), so an LPF capacitor may be coupled to the input without buffer. Capacitive feedback, however, may require initialization circuits that must be periodically re-initialized before an initial charge across the electrodes is lost through a leakage current.

Resistive feedback typically does not require initialization. Resistive feedback, however, has a low DC input impedance, and thus typically requires a low-impedance buffer inserted between LPF capacitor and the input. Moreover, resistive feedback typically cannot provide the capability to compensate for the offset of the amplifier.

FIG. 3 is a flowchart illustrating one embodiment of a method for measuring a signal using a programmable gain amplifier. The method begins at step 110, where monitor circuit 28 receives an input signal. The input signal may comprise, for example, a cross correlation value. Controller 80 sets gain numerator GN of a gain value at step 112, and sets gain denominator GD of the gain value at step 114.

Programmable gain amplifier 75 applies a gain to the input signal according to the gain value to yield an output signal at step 116. Comparators 76 and 78 determine whether the output signal is within predetermined threshold values at step 118. If the output signal is within the threshold values, the method proceeds to step 119. If the measurement is the first measurement, the method proceeds to step 120, where controller 80 determines the input signal measurement to be equal to the reference threshold value. The method then proceeds to step 122. If the measurement is not the first measurement, the method proceeds to step 121, where controller 80 determines the input signal measurement to be equal to the previous input signal measurement. The method proceeds to step 122.

If the output signal is not within the threshold values at step 118, the method proceeds to step 130, where comparators 76 and 78 determine whether the output signal is greater than or less than the threshold values. If the output signal is less than a lower threshold value, the method proceeds to step 132, where controller 80 determines an input signal measurement from the lower threshold value, the reference value, and the reciprocal of the gain value. Equation (2) may be used to calculate the input signal measurement. The method then proceeds to step 122. If the output signal is greater than an upper threshold value, the method proceeds to step 134, where controller 80 determines an input signal measurement from the upper threshold value, the reference value, and the reciprocal of the gain value. Equation (3) may be used to calculate the input signal measurement. The method then proceeds to step 122.

Controller 80 reports the input signal measurement at step 122. Controller 80 adjusts the numerator and denominator of the gain value in response to the reported measurements at step 124. For example, the gain value may be decreased in order to increase the probability that an input signal falls within the threshold values, or the gain value may be increased in order to increase the probability that the input signal measurement falls outside of the threshold values.

Controller 80 determines whether there is next gain value at step 126. A next gain value may be processed if, for example, more measurements with different gain values are needed in order to increase the accuracy of the input signal measurement. If there is a next gain value, the method returns to step 116 to apply the next gain value. If there is no next gain value, the method proceeds to step 140. Controller 80 determines whether there is a next input signal at step 140. A next input signal may be processed if, for example, more signals are needed in order to increase the accuracy of the input signal measurement. If there is a next input signal at step 140, the method returns to step 110 to receive the next input signal. If there is no next input signal at step 140, the method terminates.

Steps may be modified, added, or omitted without departing from the scope of the invention. For example, steps 116 through 126 may be repeated until an input signal measurement of a desired accuracy is achieved. Additionally, steps may be performed in any suitable order without departing from the scope of the invention. For example, setting the gain denominator at step 112 may be performed before setting the gain denominator at step 110.

Certain embodiments of the invention may provide one or more technical advantages. A technical advantage of one embodiment may be that a monitor circuit measures an input signal by applying a gain, represented by a gain value, to the input signal to yield an output signal. The input signal may be determined from the output signal and the reciprocal of gain value. The monitor may provide more precise measurements around certain values and less precise measurements around other values.

Although an embodiment of the invention and its advantages are described in detail, a person skilled in the art could make various alterations, additions, and omissions without departing from the spirit and scope of the present invention as defined by the appended claims.

What is claimed is:

1. A method for measuring a signal, comprising:
   setting a gain numerator of a gain value using a gain numerator signal;
   setting a gain denominator of the gain value using a gain denominator signal, the gain value comprising a ratio of the gain numerator to the gain denominator;
   receiving an input signal;
   adjusting the input signal in accordance to the gain value to yield an output signal;
   determining whether the output signal is within or outside of a threshold range;
   measuring the input signal according to the output signal and a reciprocal of the gain value, the reciprocal comprising a ratio of the gain denominator to the gain numerator; and
   adjusting the gain value in accordance with the determination of whether the output signal is within or outside of the threshold range by performing at least one of he following:
      adjusting the gain numerator signal; and
      adjusting the gain denominator signal.

2. The method of claim 1, wherein measuring the input signal according to the output signal and the reciprocal of the gain value comprises:
   determining that the output signal is outside of the threshold range; and
   reporting that the output signal is outside of the threshold range.

3. The method of claim 1, wherein measuring the input signal according to the output signal and the reciprocal of the gain value comprises:
   determining that the output signal is within the threshold range; and
   calculating the input signal by multiplying the reciprocal of the gain value and the output signal.

4. The method of claim 1, wherein:
   setting the gain numerator of the gain value comprises setting a first resistance of a gain amplifier; and
   setting the gain denominator of the gain value comprises setting a second resistance of the gain amplifier.

5. The method of claim 1, wherein:
   setting the gain denominator of the gain value comprises setting a first capacitance of a gain amplifier; and
   setting the gain numerator of the gain value comprises setting a second capacitance of the gain amplifier.

6. An apparatus for measuring a signal, comprising:
   an input operable to receive an input signal;
   a controller coupled to the input and operable to:
      set a gain numerator of a gain value using a gain numerator signal; and
      set a gain denominator of the gain value using a gain denominator signal, the gain value comprising a ratio of the gain numerator to the gain denominator; and
   a gain amplifier coupled to the controller and operable to adjust the input signal in accordance to the gain value to yield an output signal, the controller being operable to:
      determine whether the output signal is within or outside of a threshold range;
      measure the input signal according to the output signal and a reciprocal of the gain value, the reciprocal comprising a ratio of the gain denominator to the gain numerator: and
      adjust the gain value in accordance with the determination of whether the output signal is within or outside of the threshold range by performing at least one of the following:
         adjusting the gain numerator signal; and
         adjusting the gain denominator signal.

7. The apparatus of claim 6, wherein the controller is operable to measure the input signal according to the output signal and the reciprocal of the gain value by:
   determining that the output signal is outside of the threshold range; and
   reporting that the output signal is outside of the threshold range.

8. The apparatus of claim 6, wherein the controller is operable to measure the input signal according to the output signal and the reciprocal of the gain value by:
   determining that the output signal is within the threshold range; and
   calculating the input signal by multiplying the reciprocal of the gain value and the output signal.

9. The apparatus of claim 6, wherein the controller is operable to:
   set the gain numerator of the gain value by setting a first resistance of the gain amplifier; and
   set the gain denominator of the gain value by setting a second resistance of the gain amplifier.

10. The apparatus of claim 6, wherein the controller is operable to:
    set the gain denominator of the gain value by setting a first capacitance of a gain amplifier; and
    set the gain numerator of the gain value by setting a second capacitance of the gain amplifier.

11. Logic for measuring a signal, the software embodied in a medium and operable to:
    set a gain numerator of a gain value using a gain numerator signal;
    set a gain denominator of the gain value using a gain denominator signal, the gain value comprising a ratio of the gain numerator to the gain denominator;
    receive an input signal;
    adjust the input signal in accordance to the gain value to yield an output signal;
    determine whether the output signal is within or outside of a threshold range;
    measure the input signal according to the output signal and a reciprocal of the gain value, the reciprocal comprising a ratio of the gain denominator to the gain numerator; and
    adjust the gain value in accordance with the determination of whether the output signal is within or outside of the threshold range by performing at least one of the following:
       adjusting the gain numerator signal; and
       adjusting the gain denominator signal.

12. The logic of claim 11, operable to measure the input signal according to the output signal and the reciprocal of the gain value by:
    determining that the output signal is outside of the threshold range; and reporting that the output signal is outside of the threshold range.

13. The logic of claim 11, operable to measure the input signal according to the output signal and the reciprocal of the gain value by:

determining that the output signal is within the threshold range; and calculating the input signal by multiplying the reciprocal of the gain value and the output signal.

14. The logic of claim 11, operable to:

set the gain numerator of the gain value by setting a first resistance of a gain amplifier; and set the gain denominator of the gain value by setting a second resistance of the gain amplifier.

15. The logic of claim 11, operable to:

set the gain denominator of the gain value by setting a first capacitance of a gain amplifier; and set the gain numerator of the gain value by setting a second capacitance of the gain amplifier.

16. A system for measuring a signal, comprising:

means for setting a gain numerator of a gain value using a gain numerator or signal;

means for setting a gain denominator of the gain value using a gain denominator signal, the gain value comprising a ratio of the gain numerator to the gain denominator;

means for receiving an input signal;

means for adjusting the input signal in accordance to the gain value to yield an output signal;

means for determining whether the output signal is within or outside of a threshold range.

means for measuring the input signal according to the output signal and a reciprocal of the gain value, the reciprocal comprising a ratio of the gain denominator to the gain numerator; and means for adjusting the gain value in accordance with the determination of whether the output signal is within or outside of the threshold range by performing at least one of the following:

adjusting the gain numerator signal; and adjusting the gain denominator signal.

17. A method for measuring a signal, comprising:

setting a gain numerator of a gain value by setting a first resistance or a first capacitance of a gain amplifier;

setting a gain denominator of the gain value by setting a second resistance or a second capacitance of the gain amplifier, the gain value comprising a ratio of the gain numerator to the gain denominator;

receiving an input signal;

adjusting the input signal in accordance to the gain value to yield an output signal;

measuring the input signal according to the output signal and a reciprocal of the gain value, the reciprocal comprising a ratio of the gain denominator to the gain numerator, by determining whether the output signal is outside of a threshold value, by reporting that the output signal is outside of the threshold value if the output signal is outside of the threshold value, and by calculating the input signal by multiplying the reciprocal of the gain value; and the output signal if the output signal is within the threshold value; and adjusting a value selected from a group, the group consisting of the am numerator and the gain denominator, in response to the measurement of the input signal.

* * * * *

UNITED STATES PATENT AND TRADEMARK OFFICE
CERTIFICATE OF CORRECTION

PATENT NO. : 6,844,740 B2
DATED : January 18, 2005
INVENTOR(S) : Hidaka

It is certified that error appears in the above-identified patent and that said Letters Patent is hereby corrected as shown below:

<u>Column 5,</u>
Line 17, after "$V_{out}$" delete "is" and insert -- are --.
Lines 18 and 22, after "$V_1$" delete ",".

<u>Column 9,</u>
Line 23, after "numerator" delete "or".
Line 33, after "range" delete "." and insert -- ; --.

<u>Column 10,</u>
Line 29, after "value" delete ";".
Line 32, before "numerator" delete "am" and insert -- gain --.

Signed and Sealed this

Sixteenth Day of May, 2006

JON W. DUDAS
*Director of the United States Patent and Trademark Office*